United States Patent
Choi

(10) Patent No.: US 6,974,651 B2
(45) Date of Patent: Dec. 13, 2005

(54) METHOD OF MAKING A PHOTOMASK

(75) Inventor: Yo-Han Choi, Hwaseong-Gun (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 250 days.

(21) Appl. No.: 10/438,990

(22) Filed: May 16, 2003

(65) Prior Publication Data

US 2004/0038136 A1    Feb. 26, 2004

(30) Foreign Application Priority Data

Aug. 22, 2002  (KR) .................. 10-2002-0049779

(51) Int. Cl.⁷ .............................................. G03F 1/00
(52) U.S. Cl. ........................................................ 430/5
(58) Field of Search .............................. 430/5

(56) References Cited

U.S. PATENT DOCUMENTS 6,410,191 B1 *  6/2002  Nistler et al. .................. 430/5

FOREIGN PATENT DOCUMENTS

JP            10-207036          8/1998

\* cited by examiner

*Primary Examiner*—Geraldine Letscher
(74) *Attorney, Agent, or Firm*—Volentine Francos & Whitt PLLC

(57) ABSTRACT

A method of making a photomask ensures that the mask pattern is precisely formed. A mask blank is provided in which an opaque film and a mask film are disposed on a transparent substrate. The mask film and the opaque film are successively etched to form an opaque pattern and a mask pattern. Next, a dimension of the opaque pattern is measured. If the measured dimension of the opaque pattern is smaller than a reference value, the opaque pattern is etched using the mask pattern as an etching mask to attain the desired dimension of the opaque pattern. The mask pattern is then removed.

13 Claims, 5 Drawing Sheets

METHOD OF MAKING A PHOTOMASK

BACKGROUND OF THE INVENTION

1. Field of the Invention

The present invention relates to a method of making a photomask used in the fabricating of a semiconductor device.

2. Description of the Related Art

In general, the fabricating of a semiconductor device includes a photolithographic process in which a photoresist is deposited on a semiconductor substrate, and a pattern of a photomask (original layout) is transcribed onto the photoresist to form a photoresist pattern. The photomask is manufactured from a photomask blank comprising a transparent substrate, and a layer of opaque material disposed on the transparent substrate. The opaque material typically comprises chromium (Cr) and is etched to form an opaque pattern constituting the pattern f the photomask. Photomasks that have been widely used in recent years include phase shift masks and a half tone masks. A phase shift mask is one that includes a phase shift film disposed on the opaque layer, and the half tone mask is a mask wherein fine holes are formed in a layer that defines the mask pattern.

Once the mask pattern is copied onto the photoresist on the semiconductor substrate and the photoresist is patterned, the patterned photoresist is used as mask in a subsequent process of etching an underlying layer to form a component of the semiconductor device, such as a wiring layer. Accordingly, the dimensions of the patterned layer(s) of the photomask must be very precise to meet the ever-increasing demand for the scaling down of semiconductor devices.

A conventional method of making a phase shift mask will now be described below with reference to FIG. 1 through FIG. 3.

Referring to FIG. 1, a photoresist pattern 18 is formed on a mask blank in which an opaque film 18 is disposed on a transparent substrate 10. The opaque film 14 is patterned using the photoresist pattern 18 as an etching mask to form an opaque pattern 14a (see FIG. 2). In the case of a phase shift mask, the mask blank includes a phase shift film 12 disposed on the substrate 10 below the opaque film 18. On the other hand, a binary mask does not include the phase shift film 12. In the case of a half tone mask, fine holes are formed in the phase shift film 12 or the opaque film 14.

Referring to FIG. 2 and FIG. 3, a dimension L1 of the opaque pattern 14a is measured for checking the accuracy in the forming of the pattern 14a. Following the removal of the photoresist pattern 18, the phase shift film 12 is etched using the opaque pattern 14a as a mask to form a phase shift pattern 12a.

In the conventional method of making a photomask as described above, a dimension of the opaque pattern is measured while the photoresist pattern is disposed thereon. If the measured dimension of the opaque pattern is smaller than a reference value, additional etching is carried out until the dimension of the opaque pattern is approximately the same as the reference value.

Unfortunately, in this conventional method a polymer 20 comprising carbon group is formed on the sidewall of the opaque pattern 14a. The build-up of polymer 20 thwarts the efforts for precisely measuring the actual dimension L2 of the opaque pattern 14a. Undoubtedly, the dimension of the opaque pattern 14a can be measured after the photoresist pattern 18 and the polymer 20 are removed. However, it then becomes substantially impossible to correct the opaque pattern 14a in the event that the dimension of the opaque pattern 14a is different from the reference value. Therefore, it is in fact necessary to measure the dimension of the opaque pattern 14a while the photoresist pattern 18 is disposed on the opaque pattern.

SUMMARY OF THE INVENTION

Therefore, an object of the present invention is to provide a method of making a photomask, which allows the dimension of an opaque pattern of the mask to be precisely measured. A further object of the present invention is to provide a method of making a photomask, which allows for a dimension of an opaque pattern of the mask to be corrected if the dimension of the opaque pattern, after it is first formed, is different from a reference value. According to an aspect of the present invention, a method of making a photomask employs a mask film having an etch selectivity with respect to the opaque film that is to be etched in forming the mask pattern. A mask blank is provided in which the opaque film and the mask film are disposed on a transparent substrate. The mask film and the opaque film are sequentially etched to form an opaque pattern and a mask pattern, respectively. A dimension of the opaque pattern is then measured. If the measured dimension of the opaque pattern is smaller than a reference value, the opaque pattern is etched using the mask pattern as an etching mask to correct the dimension of the opaque pattern and thereby form it precisely according to design specifications.

This method is applicable to a method of making a phase shift mask, as well. In this case, the mask blank comprises a phase shift film, an opaque film, and a mask film disposed on a transparent substrate. The mask film and the opaque film are sequentially etched to form an opaque pattern and a mask pattern, respectively. A dimension of the opaque pattern is measured. If the dimension of the opaque pattern is smaller than a reference value, a sidewall of the opaque pattern is etched using the mask pattern as an etching mask to correct the dimension of the opaque pattern and thereby form it precisely according to design specifications. Then the phase shift film is etched to form a phase shift pattern. The mask film may be made of the same material as the phase shift film so that it can be removed while the phase shift film is being etched.

DETAILED DESCRIPTION OF THE PREFERRED EMBODIMENTS

A first embodiment of a method of making a photomask according to the present invention will be described below with reference to FIG. 4 through FIG. 7.

Figure 1:
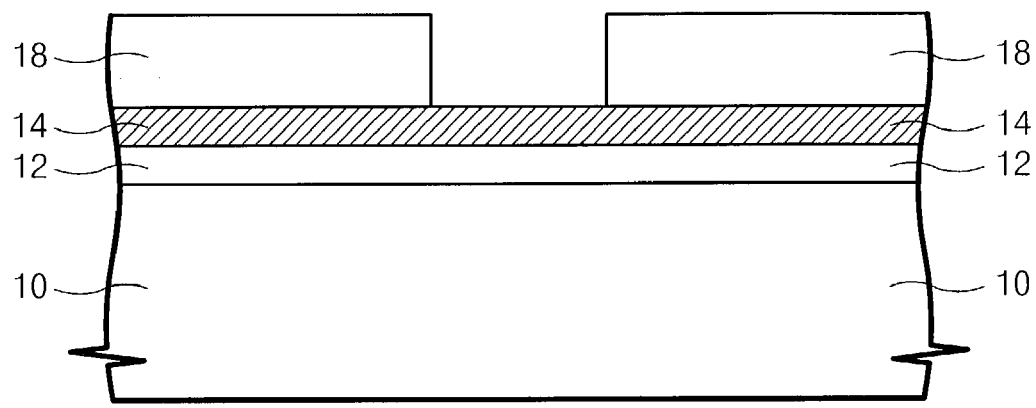
FIG. 1 through FIG. 3 are cross-sectional views of mask blank showing a conventional method of making a photomask.
Figure 2:
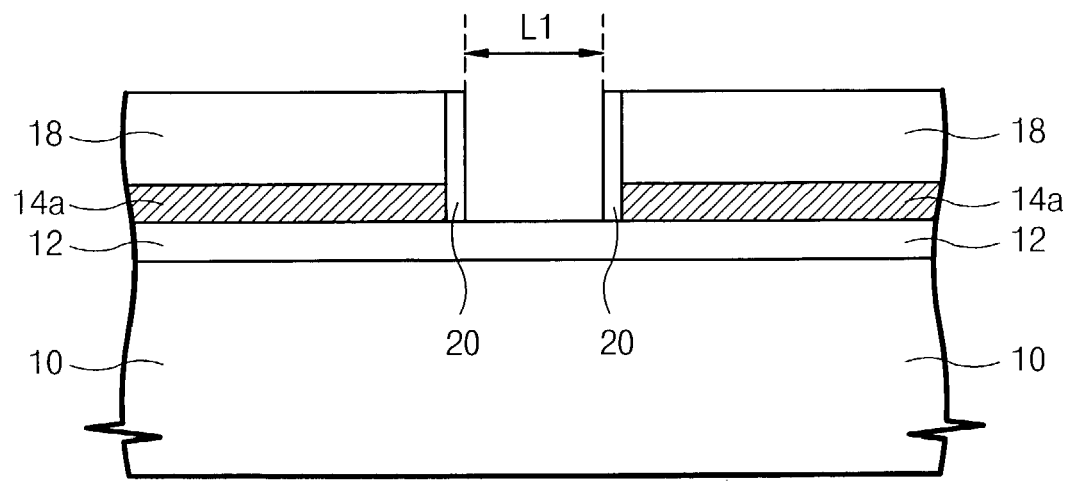
Figure 3:
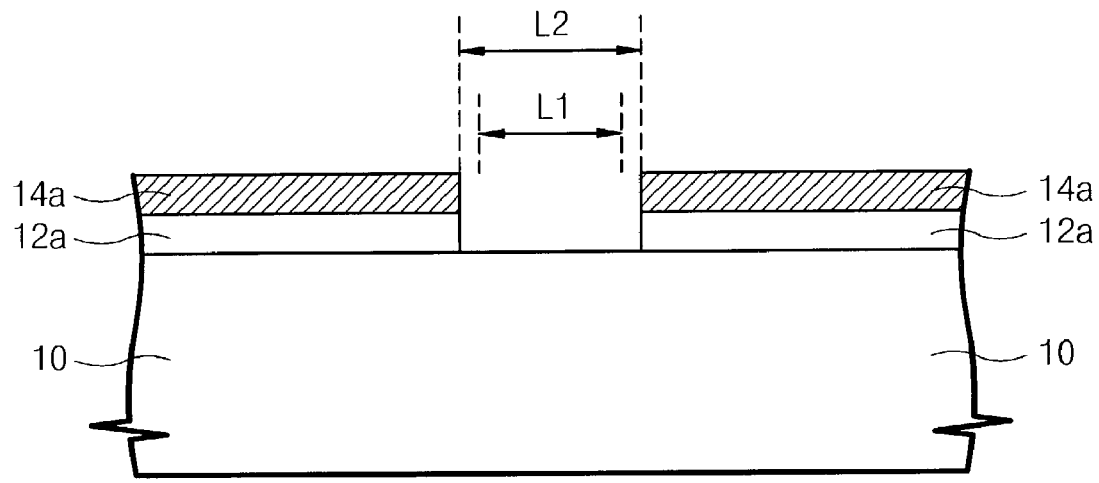
Figure 4:
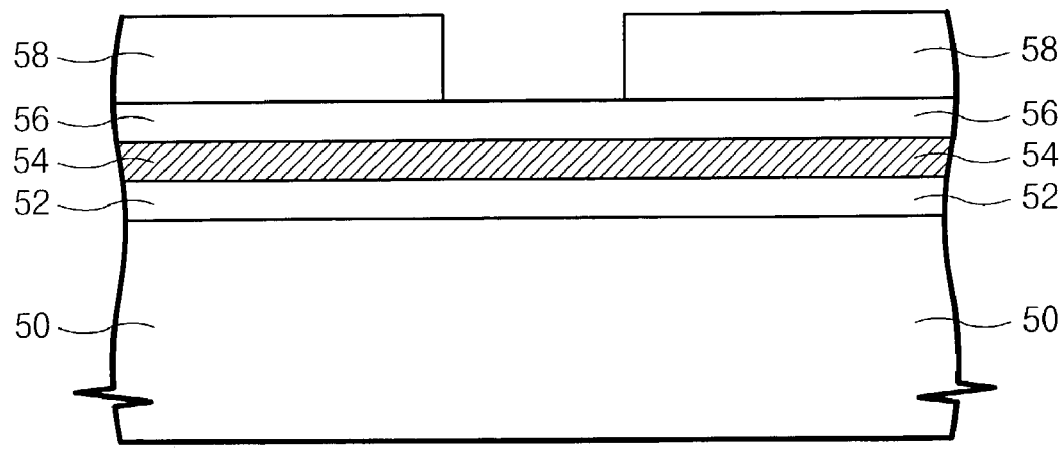
FIG. 4 through FIG. 7 are cross-sectional views of a mask blank showing a first embodiment of a method of making a photomask according to the present invention.

Referring first to FIG. 4, a mask blank is prepared in which a phase shift film 52, an opaque film 54, and a mask film 56 are sequentially stacked on a transparent substrate 50. A photoresist pattern 58 is formed on the mask blank. This mask blank is used for manufacturing a phase shift mask including a half tone phase shift mask. The phase shift film 52 may be made of molybdenum silicide oxide (MoSiO) or molybdenum silicide oxide nitride (MoSiON). However, the present invention is applicable to forming masks that do not include a phase shift film. The opaque film 54 may be made of a material comprising chromium (Cr).

The mask film 56 is a material film having an etch selectivity with respect to the opaque film 54, and may be the same material as the phase shift film 52 or silicon oxide.

Figure 5:
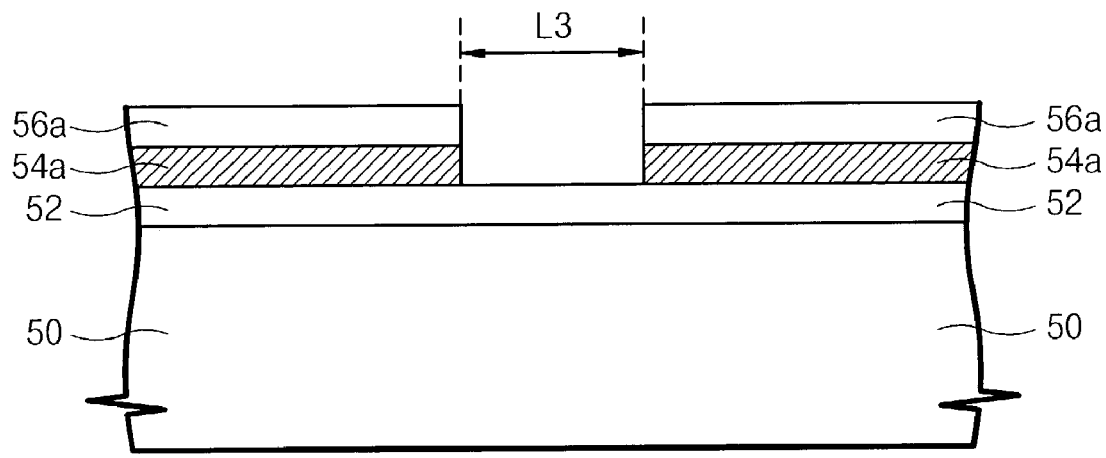

Referring to FIG. 5, the mask film 56 and the opaque film 54 are etched using the photoresist pattern 58 as an etching mask to form an opaque pattern 54a and a hard mask pattern 56a stacked on the phase shift film 52. The etching of forming the opaque pattern 54a and mask pattern 56a may be a wet etch or a dry etch process, although wet-etching is preferred if a precise pattern is to be formed. The photoresist pattern is then removed. Another approach of the present invention is etching the mask film 56 using the photoresist pattern 58 as an etching mask, removing the photoresist pattern 58, and subsequently etching the opaque film 54 using the mask pattern 56a as an etching mask to form the opaque pattern 54a.

Next, a dimension L3 of the opaque pattern 54a is measured to check the accuracy of the opaque pattern 54a. However, a dimension of the opaque pattern 54a is measured following the removal of the photoresist pattern 58, unlike the conventional method. Therefore, the actual dimension of the opaque pattern may be precisely measured. If the dimension L3 of the opaque pattern 54a is smaller than a reference value, the sidewall of the opaque pattern 54a is additionally etched using the mask pattern 56a as an etching mask. The duration over which the opaque pattern 54a is to be additionally etched so as to attain the desired dimension (corresponding to that of the reference value) may be predetermined based on the known relationship between the etchant used and the rate at which the etchant will etch the material of the opaque pattern 54a.

Figure 6:
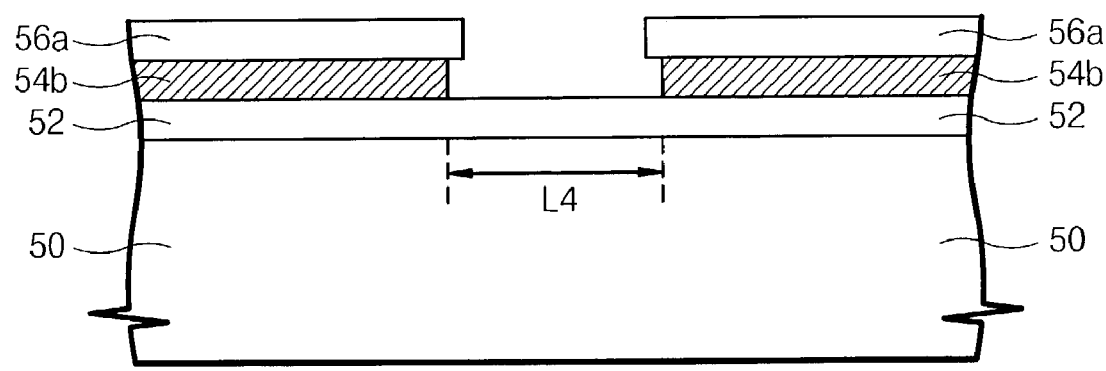

FIG. 6 shows the opaque pattern 54a etched using the mask pattern 56a as an etching mask to form a corrected opaque pattern 54b whose dimension L4 is substantially the same as a reference value. The opaque film 54 and the opaque pattern 54a may be plasma-etched using an etching gas comprising chlorine (Cl). In this case, the power and gas pressure are easily controlled to obtain the best profile for the opaque pattern 54a.

Figure 7:
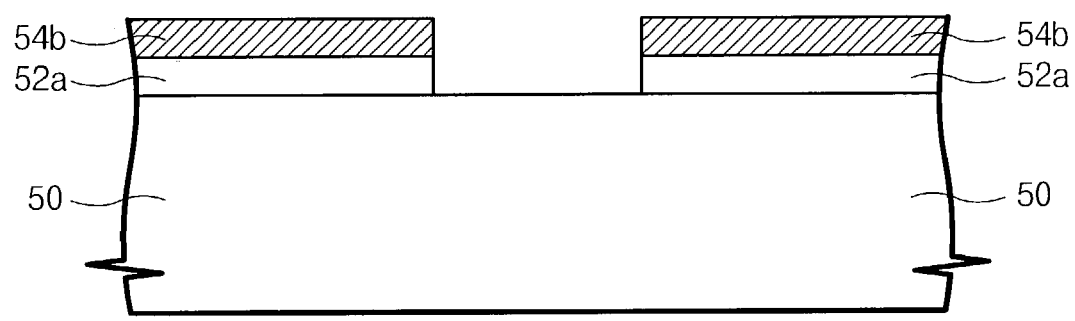

Referring to FIG. 7, the hard mask pattern 56a is removed. The phase shift film 52 is then etched using the opaque pattern 54a/54b as an etching mask to form a phase shift pattern 52a beneath the opaque pattern 54a/54b.

A second embodiment of a method of making a photomask according to the present invention is described below with reference to FIG. 8 through FIG. 10.

Figure 8:
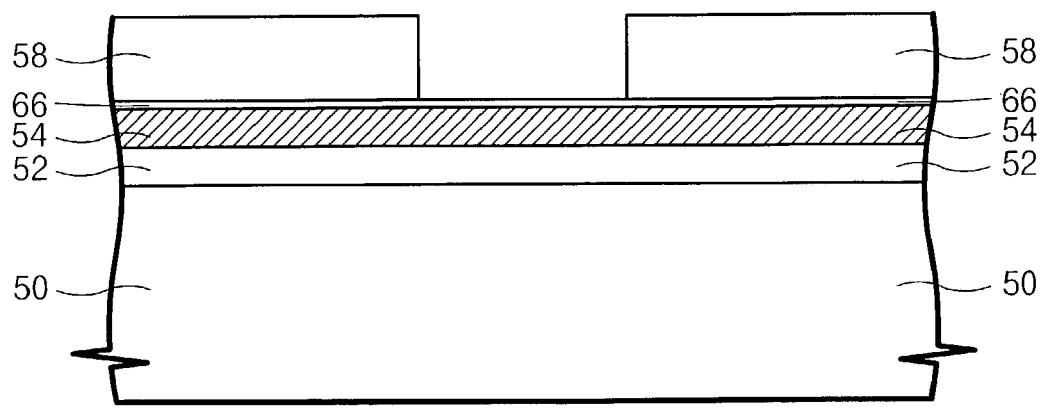
FIG. 8 through FIG. 10 are cross-sectional views of a mask blank showing a second embodiment of a method of making a photomask according to the present invention.

Referring now to FIG. 8, a mask blank is prepared in which a phase shift film 52, an opaque film 54, and a mask film 66 are sequentially formed on a transparent substrate 50. The mask blank does not include the phase shift film 52 in the case of a binary mask. Unlike the first embodiment, the mask film 66 is thinner than the phase shift film 52. A photoresist pattern 58 is formed on the mask film 66.

Figure 9:
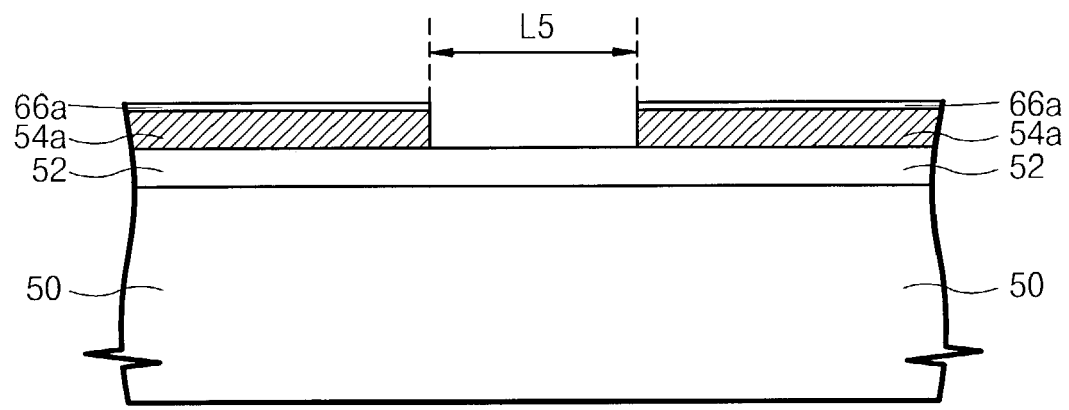
Figure 10:
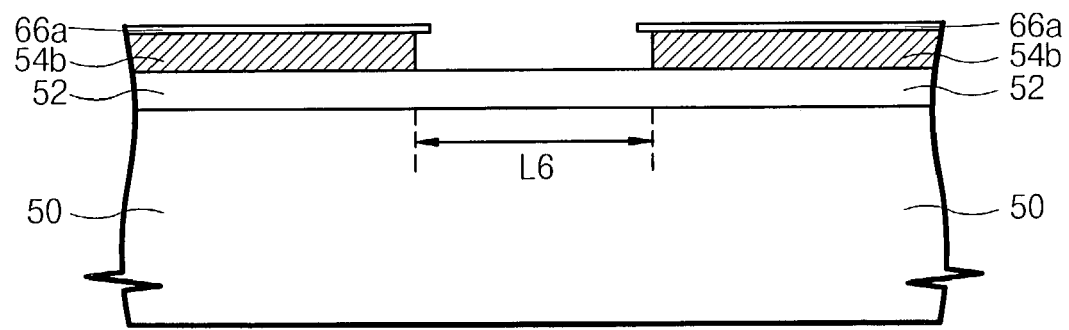

Referring to FIG. 9, the mask film 66 and the opaque film 54 are etched using the photoresist pattern 58 as an etching mask to form a mask pattern 66a and an opaque pattern 54a. Subsequently, the photoresist pattern 58 is removed. Alternatively, the mask pattern 66a is formed using the photoresist pattern 58 as an etching mask, the photoresist pattern 58 is removed, and then the opaque film 54 is etched using the mask pattern 66a as an etching mask to form the opaque pattern 54a.

A dimension L5 of the opaque pattern 54a is then measured. Referring to FIG. 10, if the dimension L5 of the opaque pattern 54a is smaller than a reference value, the sidewall of the opaque pattern 54a is etched using the mask pattern 66a as an etching mask to form a corrected opaque pattern 54b having a dimension L6 corresponding to the reference value. Similar to the first embodiment, the duration of the additional etching process is determined in consideration of the relationship between the etchant and the rate at which the material of the opaque layer 54 is etched.

Subsequently, the mask pattern 66a is removed. The phase shift film 52 is etched using the opaque pattern 54a/54b as an etching mask to form a phase shift pattern. In the second embodiment, the mask film 66 may be made of the same material as the phase shift film 52. In this case, the mask pattern 66a is thin enough to be removed while etching the phase shift film 52. Furthermore, the dimension of the opaque pattern 54a may be readily controlled because the thin mask pattern 66a is used as an etching mask when the opaque pattern 54a is formed.

In summary, a (critical) dimension of an opaque pattern is measured following the removal of a photoresist pattern, to preempt an error that would otherwise be caused by polymer that accumulates on the sidewall of the photoresist pattern. Furthermore, a mask pattern having an etch selectivity with respect to the opaque pattern is formed on the opaque pattern. Thus, the sidewall of the opaque pattern is etched using the mask pattern as an etching mask in the case wherein the dimension of the opaque pattern is different from a reference value. Accordingly, an opaque pattern having a desired critical dimension can be made.

Although the present invention has been illustrated and described with respect to the preferred embodiments thereof, the present invention is not so limited. Rather, various changes and modifications may be made to the invention without departing from the true scope and spirit of the invention as defined by the appended claims.

What is claimed is:

1. A method of making a photomask, comprising:
   (a) providing a mask blank in which an opaque film, a mask film, and a photoresist pattern are sequentially disposed on a transparent substrate;
   (b) forming an opaque pattern and a mask pattern from the opaque film and the mask film, respectively;
   (c) after removing the photoresist pattern, measuring a dimension of the opaque pattern;
   (d) correcting the dimension of the opaque pattern; and
   (e) subsequently removing the mask pattern.

2. The method as claimed in claim 1, wherein the mask film is made of a material having an etch selectivity with respect to the opaque film.

3. The method as claimed in claim 1, wherein (b) comprises:
   etching the mask film using the photoresist pattern as an etching mask;
   subsequently etching the opaque film using the mask film as an etching mask.

4. The method as claimed in claim 1, wherein (b) comprises etching the mask film and the opaque film using the photoresist pattern as an etching mask.

5. The method as claimed in claim 1, wherein (d) comprises comparing the measured dimension of the opaque pattern to a reference value, and etching a sidewall of the opaque pattern to form a corrected opaque pattern using the mask pattern as an etching mask when the measured dimension is less than the reference value.

6. A method of making a photomask, comprising:
(a) providing a mask blank in which a phase shift film, an opaque film, a mask film, and a photoresist pattern are sequentially disposed on a transparent substrate;
(b) successively forming an opaque pattern and a mask pattern from the mask film and the opaque film, respectively;
(c) removing the photoresist pattern, and then measuring a dimension of the opaque pattern;
(d) correcting the dimension of the opaque pattern, and removing the mask pattern; and
(e) etching the phase shift film to form a phase shift pattern.

7. The method as claimed in claim 6, wherein the mask film and the phase shift film are each made of a material having an etch selectivity with respect to the opaque film.

8. The method as claimed in claim 6, wherein the mask film is made of the same material as the phase shift film.

9. The method as claimed in claim 8, wherein (d) and (e) are performed at the same time by an etching process wherein the opaque pattern is used as an etching mask for the phase shift film.

10. The method as claimed in claim 8, wherein (a) comprises providing a mask blank in which the mask film is thinner than the phase shift film.

11. The method as claimed in claim 6, wherein the (b) comprises:
etching the mask film using the photoresist pattern as an etching mask;
subsequently etching the opaque film using the mask film as an etching mask.

12. The method as claimed in claim 6, wherein (b) comprises etching the mask film and the opaque film using the photoresist pattern as an etching mask.

13. The method as claimed in claim 6, wherein (d) comprises comparing the measured dimension of the opaque pattern to a reference value, and etching a sidewall of the opaque pattern to form a corrected opaque pattern using the mask pattern as an etching mask when the measured dimension is less than the reference value.

* * * * *